(12) United States Patent
Nakaoka

(10) Patent No.: US 10,607,679 B2
(45) Date of Patent: Mar. 31, 2020

(54) MEMORY DEVICE AND REFRESHING METHOD THEREOF

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/115,569

(22) Filed: Aug. 29, 2018

(65) Prior Publication Data

US 2019/0325944 A1 Oct. 24, 2019

(30) Foreign Application Priority Data

Apr. 19, 2018 (JP) ................................ 2018-080573

(51) Int. Cl.
*G11C 11/406* (2006.01)
*G06F 3/06* (2006.01)

(52) U.S. Cl.
CPC ...... *G11C 11/40611* (2013.01); *G06F 3/0604* (2013.01); *G06F 3/0653* (2013.01); *G06F 3/0659* (2013.01); *G06F 3/0673* (2013.01); *G11C 11/40618* (2013.01)

(58) Field of Classification Search
CPC ......... G11C 11/40611; G11C 11/40618; G06F 3/0604; G06F 3/0653; G06F 3/0673; G06F 3/065
See application file for complete search history.

(56) References Cited

U.S. PATENT DOCUMENTS

| 8,923,084 | B1 * | 12/2014 | Song | G11C 11/4063 |
| | | | | 365/222 |
| 9,691,466 | B1 | 6/2017 | Kim | |
| 9,818,469 | B1 * | 11/2017 | Kim | G06F 3/0619 |
| 2005/0243627 | A1 * | 11/2005 | Lee | G11C 11/406 |
| | | | | 365/222 |

(Continued)

FOREIGN PATENT DOCUMENTS

| CN | 105448341 | 3/2016 |
| JP | 2015176629 | 10/2015 |
| TW | I544186 | 8/2016 |

OTHER PUBLICATIONS

"Office Action of Japan Counterpart Application," dated Mar. 12, 2019, p. 1-p. 4.

*Primary Examiner* — Khamdan N. Alrobaie
(74) *Attorney, Agent, or Firm* — JCIPRNET

(57) ABSTRACT

A memory device and a data refreshing method of the memory device are provided. The memory device includes a memory array and a memory control circuit. The memory control circuit counts the number of access commands to generate a first count value and counts the number of refreshing commands to generate a second count value. If the first count value is equal to the second count value, the memory control circuit latches a memory bank address and a memory row address corresponding to the access commands to obtain a row hammer refreshing bank address and a row hammer refreshing row address. The memory control circuit performs a row hammer refreshing operation on a memory bank according to the row hammer refreshing bank address and the row hammer refreshing row address.

10 Claims, 12 Drawing Sheets

(56) References Cited

U.S. PATENT DOCUMENTS

| | | |
|---|---|---|
| 2014/0006703 A1 | 1/2014 | Bains et al. |
| 2015/0058549 A1* | 2/2015 | Jeffrey .................. G11C 7/02 |
| | | 711/106 |
| 2015/0085564 A1 | 3/2015 | Yoon et al. |
| 2016/0019944 A1 | 1/2016 | Jung et al. |
| 2016/0086650 A1* | 3/2016 | Kim .................. G11C 11/406 |
| | | 365/222 |
| 2016/0163372 A1* | 6/2016 | Lee .................. G11C 11/406 |
| | | 365/222 |
| 2017/0011792 A1* | 1/2017 | Oh .................. G11C 11/40622 |
| 2017/0140811 A1 | 5/2017 | Joo |
| 2018/0061476 A1* | 3/2018 | Kim .................. G11C 11/40622 |
| 2019/0221251 A1* | 7/2019 | Nakaoka .......... G11C 11/40611 |

\* cited by examiner

MEMORY DEVICE AND REFRESHING METHOD THEREOF

CROSS-REFERENCE TO RELATED APPLICATION

This application claims the priority benefit of Japan application serial no. 2018-080573, filed on Apr. 19, 2018. The entirety of the above-mentioned patent application is hereby incorporated by reference herein and made a part of this specification.

TECHNICAL FIELD

The disclosure relates to an electronic device, and more particularly to a memory device and a refreshing method of a memory device.

DESCRIPTION OF RELATED ART

According to the related art, additional refreshing operations may be performed to eliminate the row hammer phenomenon. However, since the retention time of the memory cells corresponding to the selected word line may decrease together with the increase in the number of turned-on times, if the memory cells corresponding to the selected word line are continuously refreshed, the time at which the other memory cells are to be refreshed may be delayed.

SUMMARY

A memory device includes a memory array and a memory control circuit. The memory array has a plurality of memory banks, and each of the memory banks includes a plurality of memory rows. The memory control circuit is coupled to the memory banks. The memory control circuit counts the number of times of access commands to generate a first count value. The memory control circuit counts the number of times of refreshing commands to generate a second count value. Here, the memory control circuit latches a memory bank address and a memory row address corresponding to an access command when the first count value is equal to the second count value, so as to obtain a row hammer refreshing bank address and a row hammer refreshing row address. The memory control circuit performs a row hammer refreshing operation on the memory banks according to the row hammer refreshing bank address and the row hammer refreshing row address.

In an embodiment of the disclosure, the memory control circuit latches the memory bank address and the memory row address corresponding to a first access command following a refreshing command.

In an embodiment of the disclosure, the memory control circuit resets the first count value when receiving a refreshing command.

In an embodiment of the disclosure, the memory control circuit resets the second count value when the first count value is smaller than the second count value and when a refreshing command is received.

In an embodiment of the disclosure, the memory control circuit does not latch the memory bank address and the memory row address when the access command is not received during two of the refreshing commands adjacent to each other.

In an embodiment of the disclosure, the memory control circuit includes a row hammer refreshing address buffer, an address buffer controller, and a refreshing address buffer. The row hammer refreshing address buffer is configured to receive the access command, the memory bank address corresponding to the access command, the memory row address corresponding to the access command, and the refreshing command. The row hammer refreshing address buffer counts the number of times of receiving the access command is received when the access command is received, so as to generate the first count value, and the row hammer refreshing address buffer counts the number of times of receiving the refreshing command when the refreshing command is received, so as to generate the second count value. The row hammer refreshing address buffer provides the latched memory bank address and the latched memory row address according to the access command, the refreshing command, the first count value, and the second count value. The address buffer controller is coupled to the row hammer refreshing address buffer. The address buffer controller obtains the row hammer refreshing bank address according to the latched memory bank address. The refreshing address buffer is used to receive the refreshing command, and one of the memory banks is provided with a refreshing row address according to the refreshing command.

In an embodiment of the disclosure, the row hammer refreshing address buffer includes a row hammer address latch signal generator, a plurality of memory bank address buffers, and a plurality of memory row address buffers. The row hammer address latch signal generator generates a comparison result according to the first count value and the second count value, and provides an address latch signal according to the comparison result. The memory bank address buffers receive the memory bank address corresponding to the access command and the address latch signal and latch the memory bank address according to the address latch signal. The memory row address buffers receive the memory row address corresponding to the access command and the address latch signal and latch the memory row address according to the address latch signal.

In an embodiment of the disclosure, the row hammer address latch signal generator includes a first counter, a second counter, and a logic comparison circuit. The first counter is configured to count the number of times of receiving the access command when the access command is received, so as to increment the first count value. The second counter is configured to count the number of times of receiving the refreshing command when the refreshing command is received, so as to increment the second count value. The logic comparison circuit is coupled to the first counter and the second counter and receives the access command and the refreshing command. The logic comparison circuit is configured to compare the first count value and the second count value to obtain a comparison result. According to the comparison result indicating that the first count value is equal to the second count value, the logic comparison circuit generates an enabled address latch signal.

In one or more embodiments of the disclosure, the latch operation of the row hammer refreshing bank address is performed on the memory row address where the access operation is already performed during two adjacent refreshing operations, and the refreshing operation is performed, so as to prevent the stored data from being lost because of memory cell row hammer phenomenon and reduce redundant refreshing operations.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DETAILED DESCRIPTION OF THE EMBODIMENTS

Figure 1:
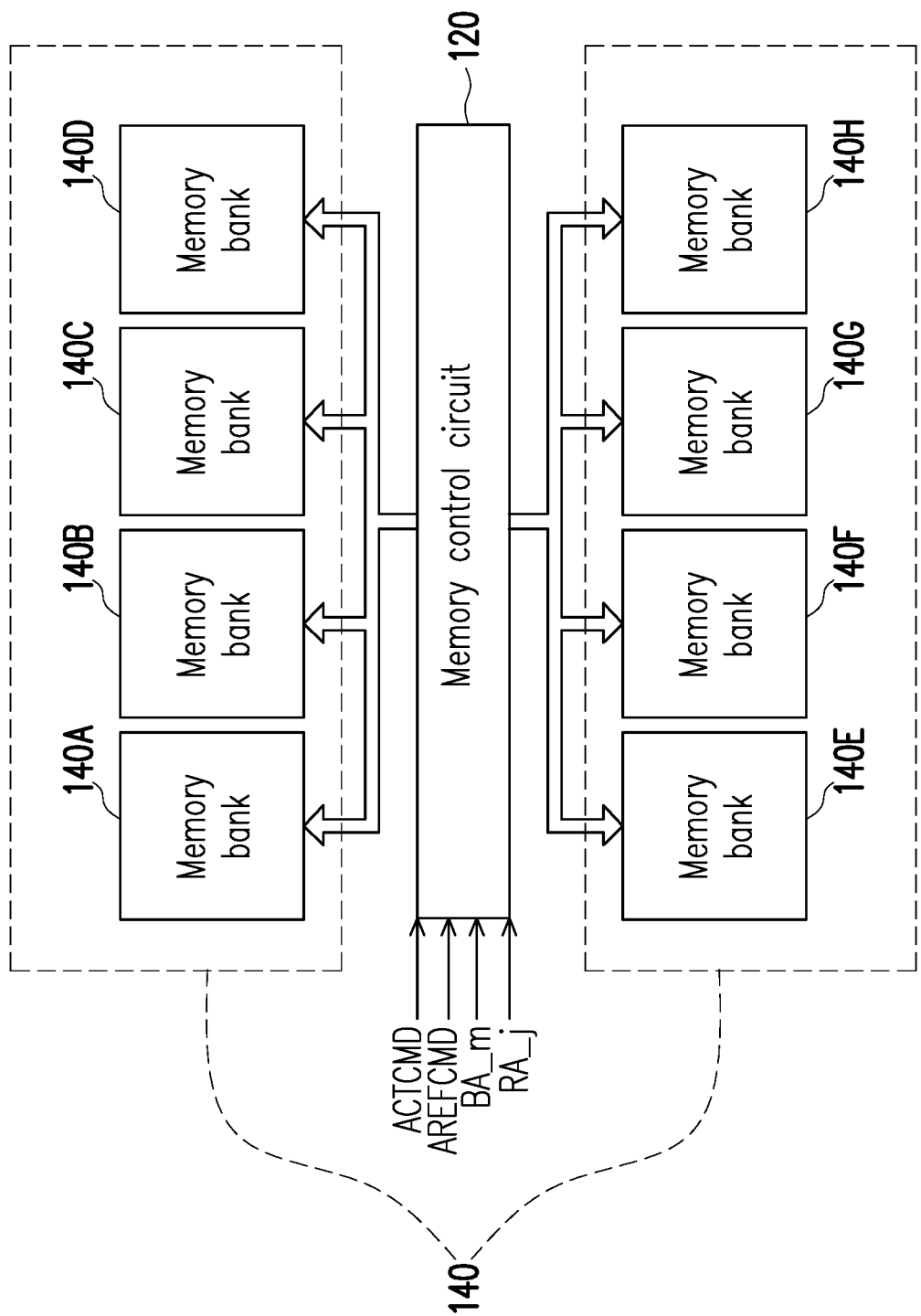
FIG. 1 is a schematic view of a memory device according to an embodiment of the disclosure.

Please refer to FIG. 1, which is a schematic view of a memory device according to an embodiment of the disclosure. The memory device 100 includes a memory array 140 and a memory control circuit 120. The memory array 140 includes memory banks 140A-140H. Each of the memory banks 140A-140H includes a plurality of memory rows. The memory control circuit 120 may update memory cell data on the memory banks 140A-140H in turn to avoid data stored in each of the memory banks from being lost. However, the number of memory banks is not limited herein.

In this embodiment, the memory control circuit 120 receives an access command ACTCMD, a refreshing command AREFCMD, a memory bank address BA_m corresponding to the access command ACTCMD, and a memory row address RA_j corresponding to the access command ACTCMD, wherein m equals 0-2, and j equals 0-13. The memory control circuit 120 obtains the row hammer refreshing bank address and the row hammer refreshing row address according to the number of times of receiving the access command ACTCMD and the refreshing command AREFCMD, and the memory control circuit 120 performs the row hammer refreshing operation on the memory banks 140A-140H according to the row hammer refreshing bank address and the row hammer refreshing row address.

Figure 2:
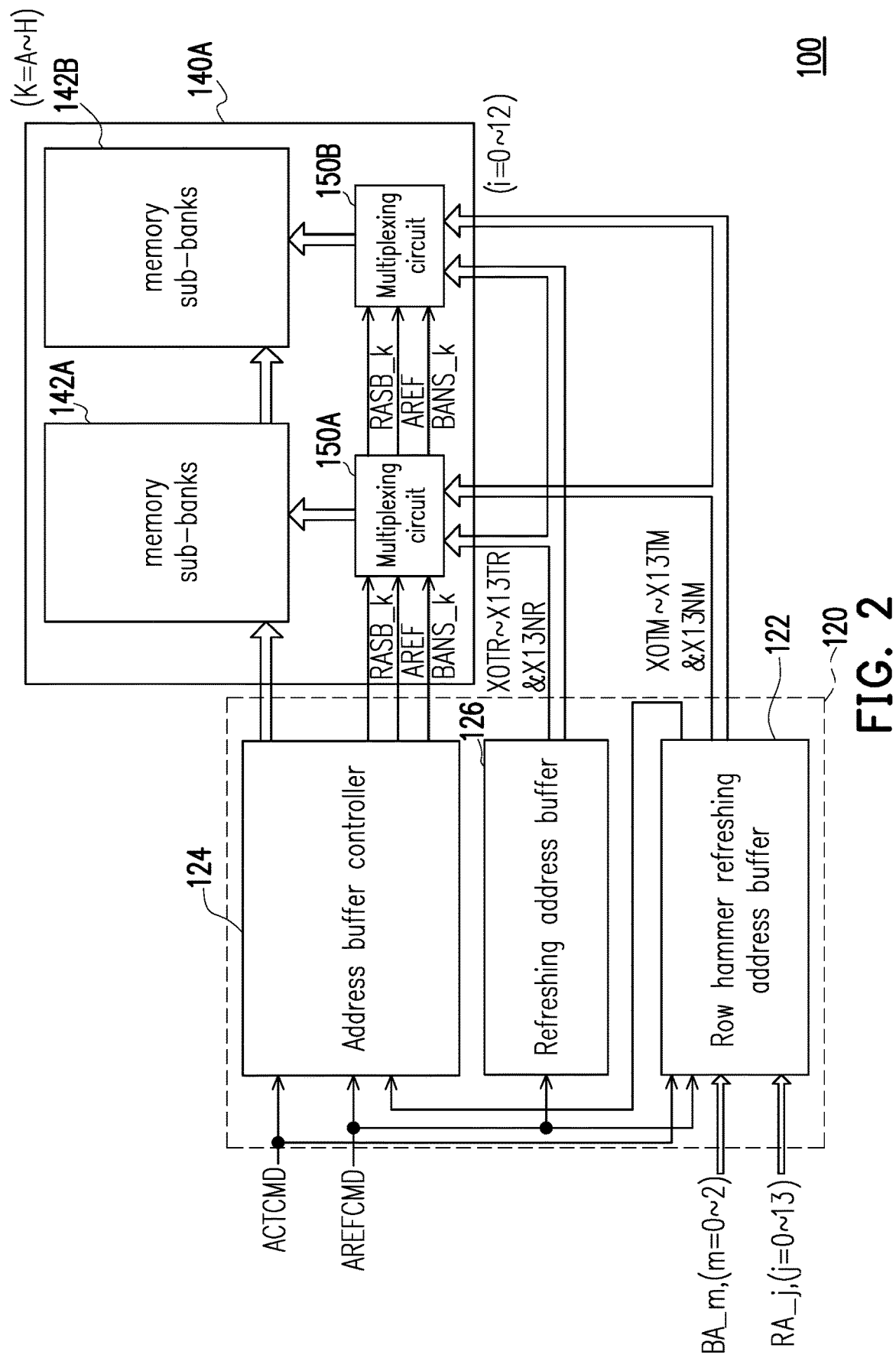
FIG. 2 is a schematic view of a memory device according to another embodiment of the disclosure.

Please refer to FIG. 2, which is a schematic view of a memory device according to another embodiment of the disclosure. According to the embodiment shown in FIG. 2, the memory bank 140A may include memory sub-banks 142A and 142B. Multiplexing circuits 150A and 150B are coupled to the memory control circuit 120, respectively. The multiplexing circuits 150A and 150B are arranged corresponding to the memory sub-banks 142A and 142B, respectively. In an embodiment of the disclosure, the memory control circuit 120 includes a row hammer refreshing address buffer 122, an address buffer controller 124, and a refreshing address buffer 126. The row hammer refreshing address buffer 122 is configured to receive the access command ACTCMD, the memory bank address corresponding to the access command ACTCMD, the memory row address BA_m corresponding to the access command ACTCMD, and the refreshing command AREFCMD. Here, m is equal to 0-2, and j is equal to 0-13. The row hammer refreshing address buffer 122 counts the number of times of receiving the access command ACTCMD when receiving the access command ACTCMD to generate a first count value C1, and counts the number of times of receiving the refreshing command when receiving the refreshing command to generate a second count value C2. According to the access command ACTCMD, the refreshing command AREFCMD, the first count value C1, and the second count value C2, the latched memory bank address BNKA_m and the latched row hammer memory row addresses X0TM-X13TM and X13NM are provided. The address buffer controller 124 is coupled to the row hammer refreshing address buffer 122. The address buffer memory controller 124 may obtain the row hammer refreshing bank address RASB_k according to the latched memory bank address BNKA_m. Besides, the refreshing address buffer 126 is configured to receive the refreshing command AREFCMD and provide the refreshing row addresses X0TR-X13TR and X13NR to the memory sub-banks 142A and 142B according to the refreshing command AREFCMD. In the present embodiment, since the memory bank 140A is divided into the memory sub-banks 142A and 142B, the refreshing operation provided in this embodiment is performed twice.

Figure 3:
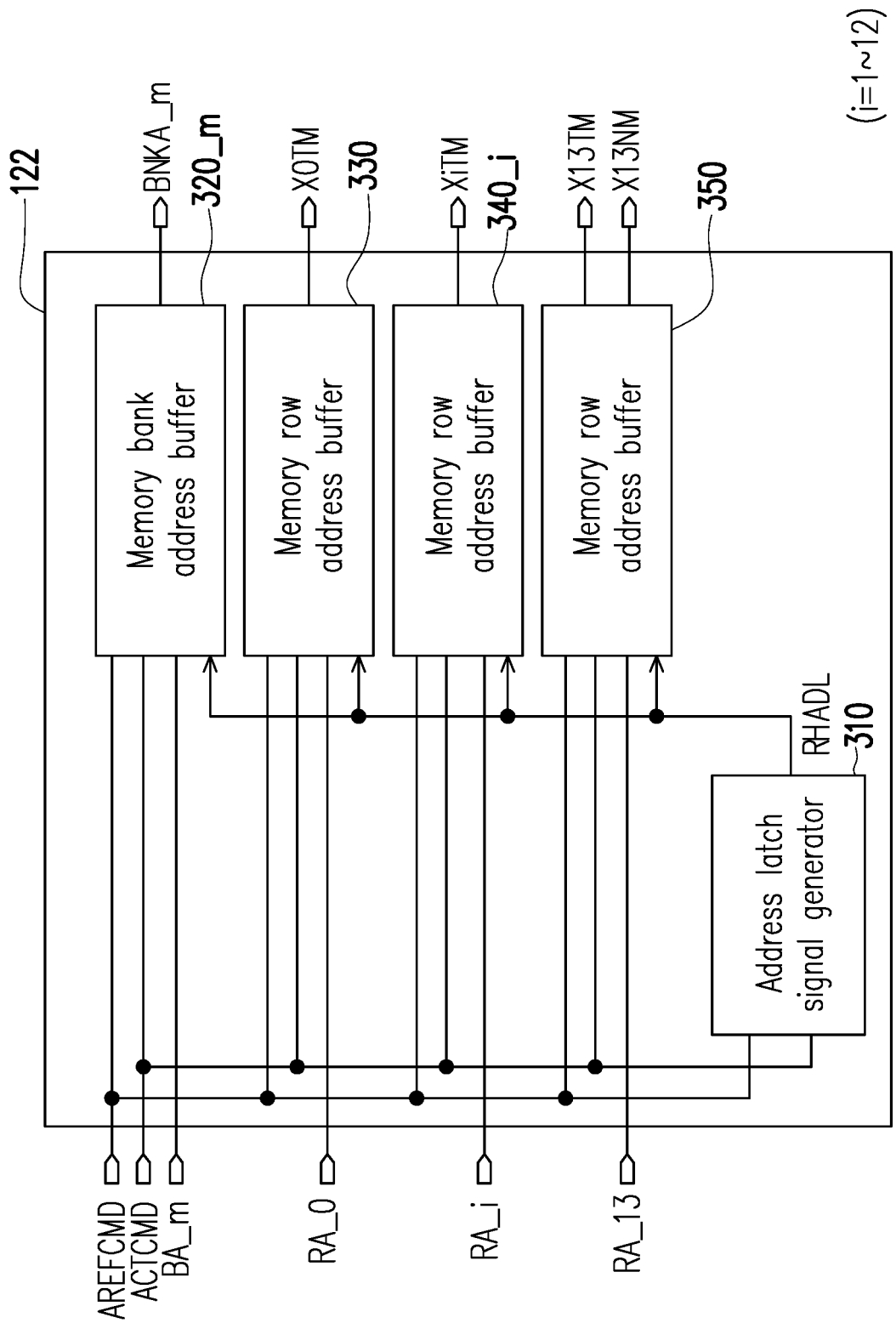
FIG. 3 illustrates schematic circuitry of a row hammer refreshing address buffer according to an embodiment of the disclosure.

Please refer to FIG. 3, which illustrates schematic circuitry of a row hammer refreshing address buffer according to an embodiment of the disclosure. In an embodiment of the disclosure, the row hammer refreshing address buffer 120 includes a row hammer address latch signal generator 310, a memory bank address buffer 320_m, and memory row address buffers 330, 340_i, and 350. Here, m is equal to 0-2, and i is equal to 1-12. The row hammer address latch signal generator 310 may generate a comparison result according to the first count value C1 and the second count value C2 and provide an address latch signal RHADL according to the comparison result. The memory bank address buffer 320_m may receive the memory bank address BA_m corresponding to the access command ACTCMD and the address latch signal RHADL and latch the memory bank address BA_m according to the address latch signal RHADL, so as to provide a latched memory bank address BNKA_m. The memory row address buffers 330, 340_i, and 350 receive the memory row address RA_i corresponding to the access command ACTCMD and the address latch signal RHADL and latch the memory row address RA_i to provide the latched row hammer memory row addresses X0TM, XiTM, X13TM, and X13NM, respectively. Here, i equals 0-12.

Figure 4:
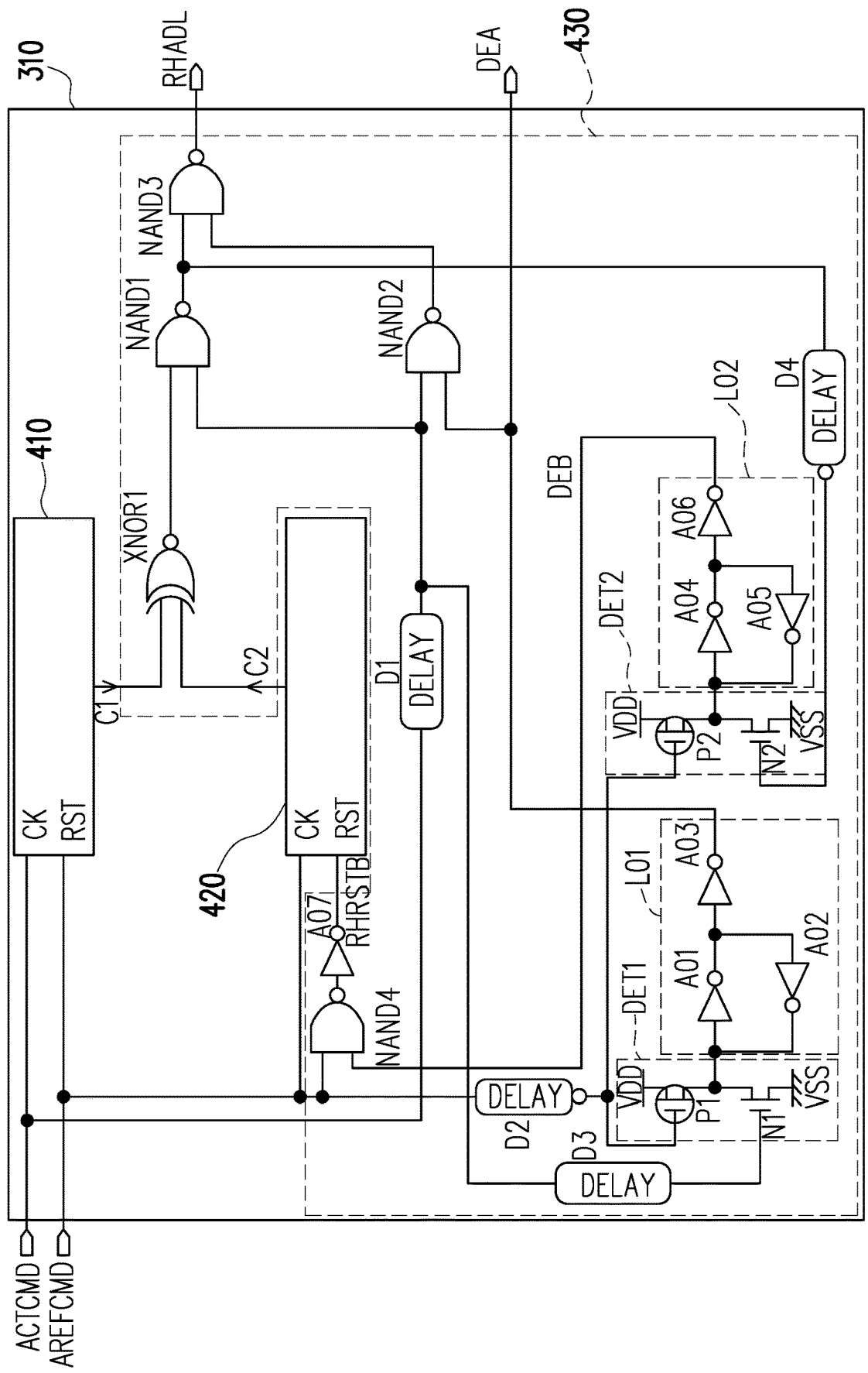
FIG. 4 illustrates schematic circuitry of a row hammer address latch signal generator according to an embodiment of the disclosure.

Please refer to FIG. 4, which illustrates schematic circuitry of a row hammer address latch signal generator according to an embodiment of the disclosure. In an embodiment depicted in FIG. 4, the row hammer address latch signal generator 310 includes a first counter 410, a second counter 420, and a logic comparison circuit 430. The first counter 410 has a receiving terminal CK and a reset input terminal RST. The receiving terminal CK of the first counter 410 is configured to receive the access command ACTCMD and count the number of times of receiving the access command ACTCMD when the access command ACTCMD is received, so as to increment the first count value C1. The reset input terminal RST of the first counter 410 is configured to reset the first count value C1 when receiving the refreshing command AREFCMD.

The second counter 420 has a receiving terminal CK and a reset input terminal RST. The receiving terminal CK of the second counter 420 is configured to receive the refreshing command AREFCMD and count the number of times of receiving the refreshing command AREFCMD when receiving the refreshing command AREFCMD, so as to increment the second count value C2. The reset input terminal RST of the second counter 420 is configured to reset the second count value C2 when receiving a reset signal RHRSTB at a high voltage level.

In the present embodiment, the refreshing command AREFCMD is generated at a fixed time, and hence the maximum count value of the first counter 410 and the second counter 420 are predictable. For example, if the interval between two adjacent refreshing commands AREFCMD is 3.9 microseconds, the row hammer address latch signal generator 310 at most receives the access command ACTCMD 312 times. Therefore, it is sufficient that the first counter 410 and the second counter 420 are 11-bit counters.

The logic comparison circuit 430 is coupled to the first counter 410 and the second counter 420. The logic comparison circuit 430 receives the access command ACTCMD, the refreshing command AREFMCD, the first count value C1, and the second count value C2. The logic comparison circuit 430 may include an exclusive-NOR gate XNOR1, NAND gates NAND1-NAND4, retarders D1-D4, detection signal generating circuits DET1 and DET2, latch circuits L01 and L02, and an inversion gate A07. A first input terminal of the exclusive-NOR gate XNOR1 is coupled to the first counter 410 to receive the first count value C1, and a second input terminal of the exclusive-NOR gate XNOR1 is coupled to the second counter 420 to receive the second count value C2. A first input terminal of the NAND gate NAND1 is configured to receive the access command ACTCMD delayed by the retarder D1, and a second input terminal of the NAND gate NAND1 is coupled to an output terminal of the exclusive-NOR gate XNOR1.

The detection signal generating circuit DET1 includes a P-type transistor P1 and an N-type transistor N1. A first terminal of the P-type transistor P1 is coupled to a system voltage VDD, and a control terminal of the P-type transistor P1 receives the refreshing command AREFCMD delayed and phase-inverted by the retarder D2. A first terminal of the N-type transistor N1 is coupled to a second terminal of the P-type transistor P1 as an output terminal of the detection signal generating circuit DET1. A second terminal of the N-type transistor N1 is coupled to the reference potential VSS. A control terminal of the N-type transistor N1 receives the access command ACTCMD delayed by the retarders D1 and D3. The P-type transistor P1 and the N-type transistor N1 may generate a detection signal DEA through the first terminal of the N-type transistor N1 and the second terminal of the P-type transistor P1 according to the delayed access command ACTCMD and the delayed refreshing command AREFCMD.

The detection signal generating circuit DET2 includes a P-type transistor P2 and an N-type transistor N2. A first terminal of the P-type transistor P2 is coupled to the system voltage VDD, and a control terminal of the P-type transistor P2 receives the refreshing command AREFCMD delayed and phase-inverted by the retarder D2. A first terminal of the N-type transistor N2 is coupled to a second terminal of the P-type transistor P2 as an output terminal of the detection signal generating circuit DET2. A second terminal of the N-type transistor N2 is coupled to the reference potential VSS. A control terminal of the N-type transistor N2 is coupled to an output terminal of the NAND gate NAND1 through the retarder D4, so as to receive the output result of the NAND gate NAND1 delayed by the retarder D4 and phase-inverted. The P-type transistor P2 and the N-type transistor N2 may generate a detection signal DEB through the first terminal of the N-type transistor N2 and the second terminal of the P-type transistor P2 according to the delayed access command ACTCMD and the output result of the NAND gate NAND1.

The latch circuit L01 includes inversion gates A01-A03. An input terminal of the inversion gate A01 and an output terminal of the inversion gate A02 are commonly coupled to the output terminal of the detection signal generating circuit DET1 to be configured as an input terminal of the latch circuit L01. An output terminal of the inversion gate A01 and an input terminal of the inversion gate A02 are commonly coupled to an input terminal of the inversion gate A03. An output terminal of the inversion gate A03 is configured as an output terminal of the latch circuit L01. An input terminal of the latch circuit L01 is coupled to the output terminal of the detection signal generating circuit DET1, so as to latch the detection signal DEA. The latch circuit L02 includes inversion gates A04-A06. An input terminal of the inversion gate A04 and an output terminal of the inversion gate A05 are commonly coupled to the output terminal of the detection signal generating circuit DET2 to be configured as an input terminal of the latch circuit L02. An output terminal of the inversion gate A04 and an input terminal of the inversion gate A05 are commonly coupled to an input terminal of the inversion gate A06. An output terminal of the inversion gate A06 is configured as an output terminal of the latch circuit L02. An input terminal of the latch circuit L01 is coupled to the output terminal of the detection signal generating circuit DET1, so as to latch the detection signal DEB.

A first input terminal of the NAND gate NAND2 is coupled to the output terminal of the latch circuit L01 to receive the latched detection signal DEA, and a second input terminal of the NAND gate NAND2 is configured to receive the access command ACTCMD delayed by the retarder D1. A first input terminal of the NAND gate NAND3 is coupled to the output terminal of the NAND gate NAND1, and a second input terminal of the NAND gate NAND3 is coupled to the output terminal of the NAND gate NAND2, so as to receive the logic computation result of the NAND gates NAND1 and NAND2. According to the logic computation result of the NAND gates NAND1 and NAND2, the NAND gate NAND3 outputs the address latch signal RHADL through its output terminal.

A first input terminal of the NAND gate NAND4 is configured to receive the refreshing command AREFCMD. A second input terminal of the NAND gate NAND4 is configured to receive the latched detection signal DEB. An input terminal of the inversion gate A07 is coupled to an output terminal of the NAND gate NAND4. The output terminal of the inversion gate A07 is coupled to the reset input terminal RST of the second counter 420.

Figure 5:
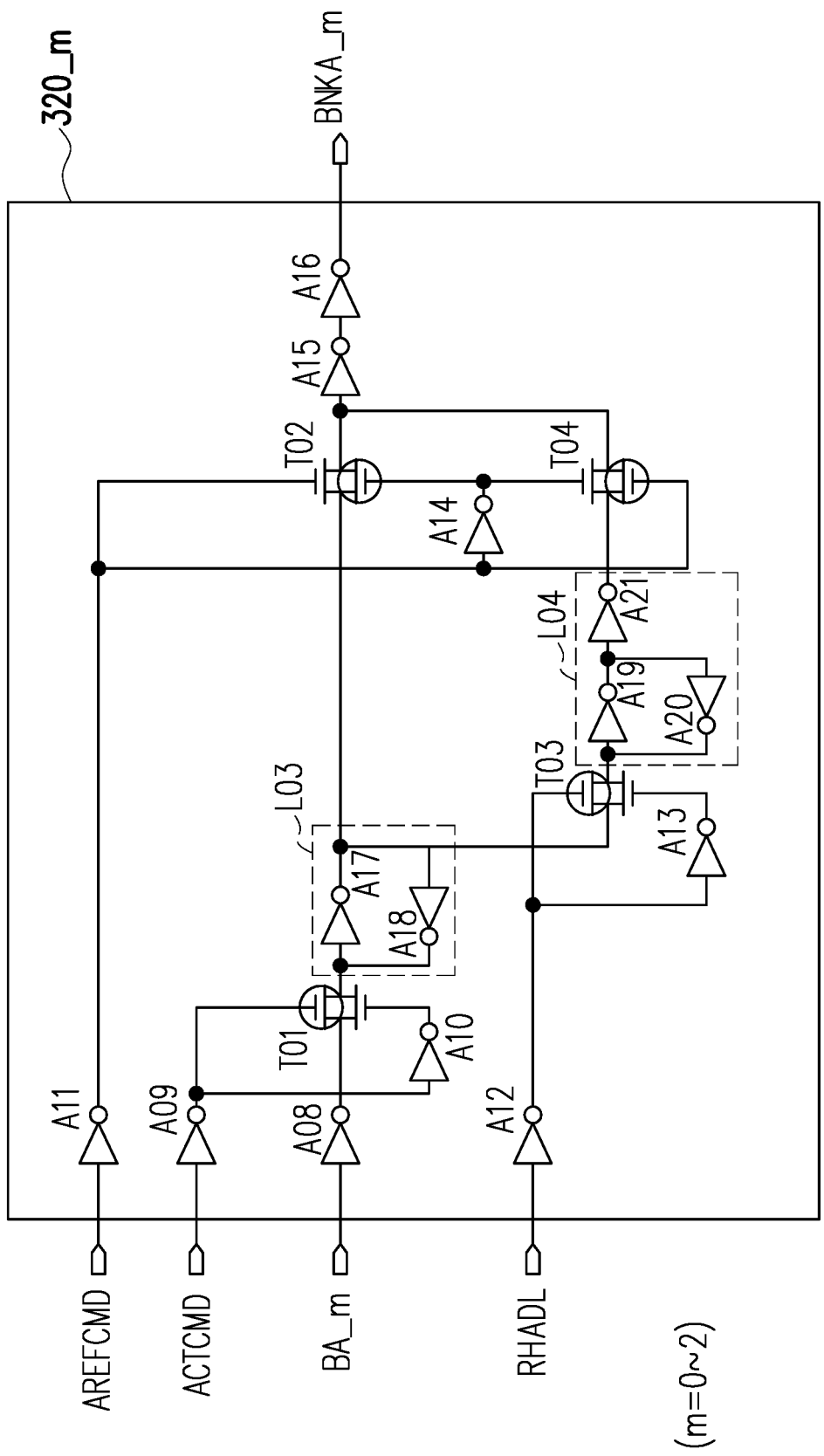
FIG. 5 illustrates schematic circuitry of a memory bank address buffer according to an embodiment of the disclosure.

Please refer to FIG. 5, which illustrates schematic circuitry of a memory bank address buffer according to an embodiment of the disclosure. The number of the memory bank address buffers 320_m is three according to the present embodiment. The memory bank address buffer 320_0 taken for example may receive the memory bank address BA_0 corresponding to the access command ACTCMD, the refreshing command AREFCMD, and the address latch signal RHADL. The memory bank address buffer 320_0 includes inversion gates A08-A16, transmission gates T01-T04, and latch circuits L03 and L04.

An input terminal of the inversion gate A08 is configured to receive the memory bank address BA_0. An output terminal of the inversion gate A08 is coupled to an input terminal of the transmission gate T01. An input terminal of the inversion gate A08 receives the access command ACTCMD. An output terminal of the inversion gate A09 is coupled to a p-channel gate of the transmission gate T01. An input terminal of the inversion gate A10 is coupled to the output terminal of the inversion gate A09. An output terminal of the inversion gate A10 is coupled to an n-channel gate of the transmission gate T01. An output terminal of the transmission gate T01 is coupled to an input terminal of the latch circuit L03. An output terminal of the latch circuit L03 is coupled to an input terminal of the transmission gate T02 and an input terminal of the transmission gate T03. The latch circuit L03 includes inversion gates A17 and A18. An input terminal of the inversion gate A17 is coupled to an output terminal of the inversion gate A18 and the output terminal of the transmission gate T01. An output terminal of the inversion gate A17 is coupled to an input terminal of the inversion gate A18. An input terminal of the inversion gate A11 is configured to receive the refreshing command AREFCMD. An output terminal of the inversion gate A11 is coupled to an n-channel gate of the transmission gate T02 and a p-channel gate of the transmission gate T04. An input terminal of the inversion gate A12 is configured to receive the address latch signal RHADL. An output terminal of the inversion gate A12 is coupled to a p-channel gate of the transmission gate T03. An input terminal of the inversion gate A13 is coupled to the output terminal of the inversion gate A12. An output terminal of the inversion gate A13 is coupled to an n-channel gate of the transmission gate T03. An output terminal of the transmission gate T03 is coupled to an input terminal of the latch circuit L04. An output terminal of the latch circuit L04 is coupled to an input terminal of the transmission gate T04. The latch circuit L04 includes inversion gates A19-A21. An input terminal of the inversion gate A19 and an output terminal of the inversion gate A20 are commonly coupled to an output terminal of the transmission gate T03. An output terminal of the inversion gate A19 and an input terminal of the inversion gate A20 are commonly coupled to an input terminal of the inversion gate A21. An output terminal of the inversion gate A21 is configured as an input terminal of the latch circuit L04. An input terminal of the inversion gate A14 is coupled to the output terminal of the inversion gate A11. An output terminal of the inversion gate A14 is coupled to a p-channel gate of the transmission gate T02 and an n-channel gate of the transmission gate T04. An input terminal of the inversion gate A15 is coupled to an output terminal of the transmission gate T02 and an output terminal of the transmission gate T04. An output terminal of the inversion gate A15 is coupled to an input terminal of the inversion gate A16. An output terminal of the inversion gate A16 is coupled to an output terminal of the memory bank address buffer 320_0.

The memory bank address buffer 320_1 taken for example may receive the memory bank address BA_1 corresponding to the access command ACTCMD. The memory bank address buffer 320_2 taken for example may receive the memory bank address BA_2 corresponding to the access command ACTCMD.

Figure 6:
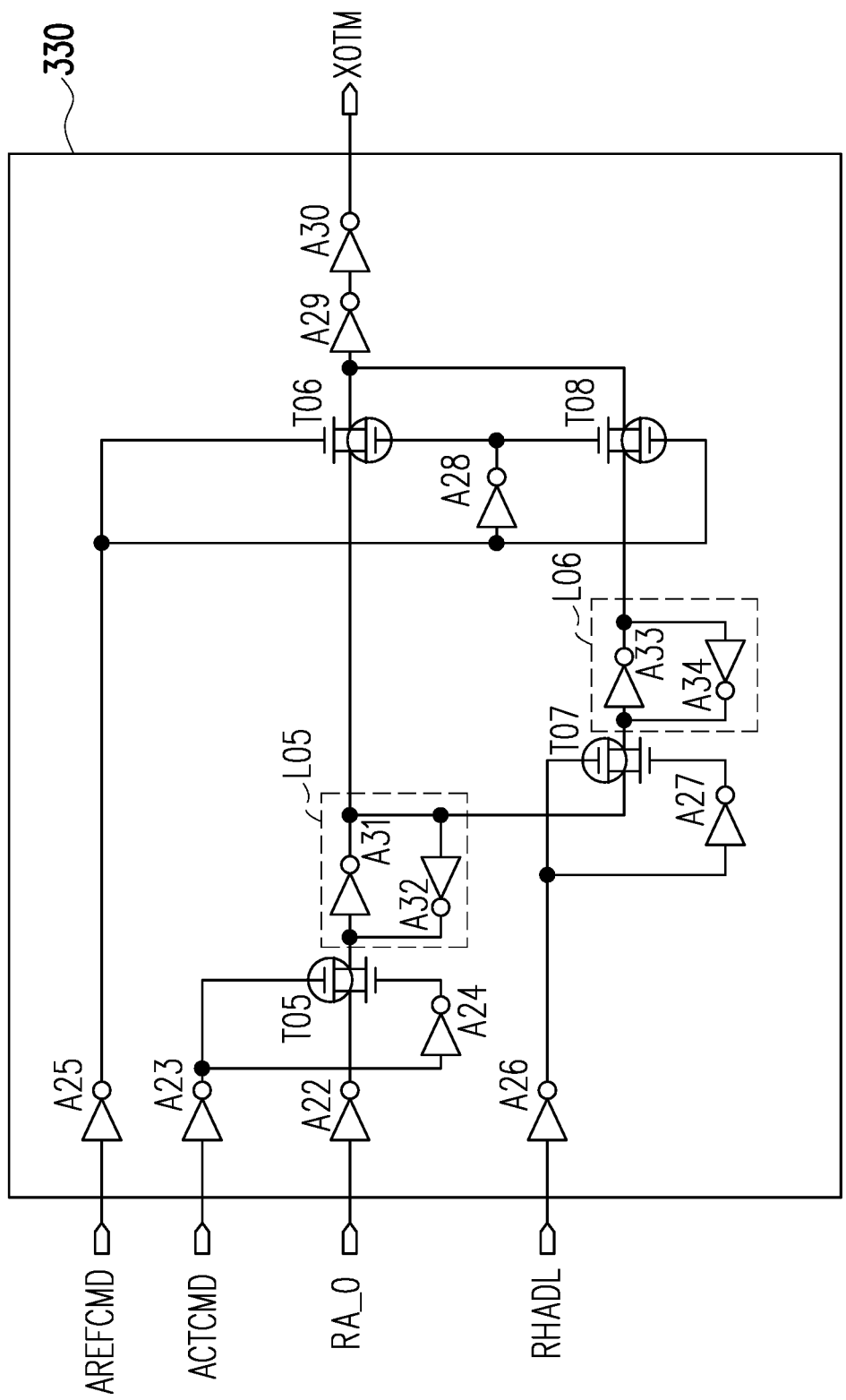
FIG. 6 illustrates schematic circuitry of a memory row address buffer according to an embodiment of the disclosure.

Please refer to FIG. 6, which illustrates schematic circuitry of a memory row address buffer according to an embodiment of the disclosure. The memory row address buffer 330 may receive the memory row address RA_0 corresponding to the access command ACTCMD, the refreshing command AREFCMD, and the address latch signal RHADL. The memory bank address buffer 320_0 includes inversion gates A22-A30, transmission gates T05-T08, and latch circuits L05 and L06.

An input terminal of the inversion gate A22 is configured to receive the memory row address RA_0. An output terminal of the inversion gate A22 is coupled to an input terminal of the transmission gate T05. An input terminal of the inversion gate A23 receives the access command ACTCMD. An output terminal of the inversion gate A23 is coupled to a p-channel gate of the transmission gate T05. An input terminal of the inversion gate A24 is coupled to the output terminal of the inversion gate A23. An output terminal of the inversion gate A24 is coupled to an n-channel gate of the transmission gate T05. An output terminal of the transmission gate T05 is coupled to an input terminal of the latch circuit L05. An output terminal of the latch circuit L05 is coupled to an input terminal of the transmission gate T06 and an input terminal of the transmission gate T07. The latch circuit L05 includes inversion gates A31 and A32. An input terminal of the inversion gate A31 is coupled to an output terminal of the inversion gate A32 and an output terminal of the transmission gate T05. An output terminal of the inversion gate A31 is coupled to an input terminal of the inversion gate A32. An input terminal of the inversion gate A25 is configured to receive the refreshing command AREFCMD. An output terminal of the inversion gate A25 is coupled to an n-channel gate of the transmission gate T06 and a p-channel gate of the transmission gate T08. An input terminal of the inversion gate A26 is configured to receive the address latch signal RHADL. An output terminal of the inversion gate A26 is coupled to a p-channel gate of the transmission gate T07. An input terminal of the inversion gate A27 is coupled to the output terminal of the inversion gate A26. An output terminal of the inversion gate A27 is coupled to an n-channel gate of the transmission gate T07. An output terminal of the transmission gate T07 is coupled to an input terminal of the latch circuit L06. An output terminal of the latch circuit L06 is coupled to an input terminal of the transmission gate T08. The latch circuit L06 includes inversion gates A33 and A34. An input terminal of the inversion gate A33 and an output terminal of the inversion gate A34 are commonly coupled to an output terminal of the transmission gate T07. An output terminal of the inversion gate A33 and an input terminal of the inversion gate A34 are commonly configured as the output terminal of the latch circuit L06. An input terminal of the inversion gate A28 is coupled to the output terminal of the inversion gate A25. An output terminal of the inversion gate A28 is coupled to a p-channel gate of the transmission gate T06 and an n-channel gate of the transmission gate T08. An input terminal of the inversion gate A29 is coupled to an output terminal of the transmission gate T06 and an output terminal of the transmission gate T08. An output terminal of the inversion gate A29 is coupled to an input terminal of the inversion gate A30. An output terminal of the inversion gate A30 is coupled to an output terminal of the memory row address buffer 330.

Figure 7:
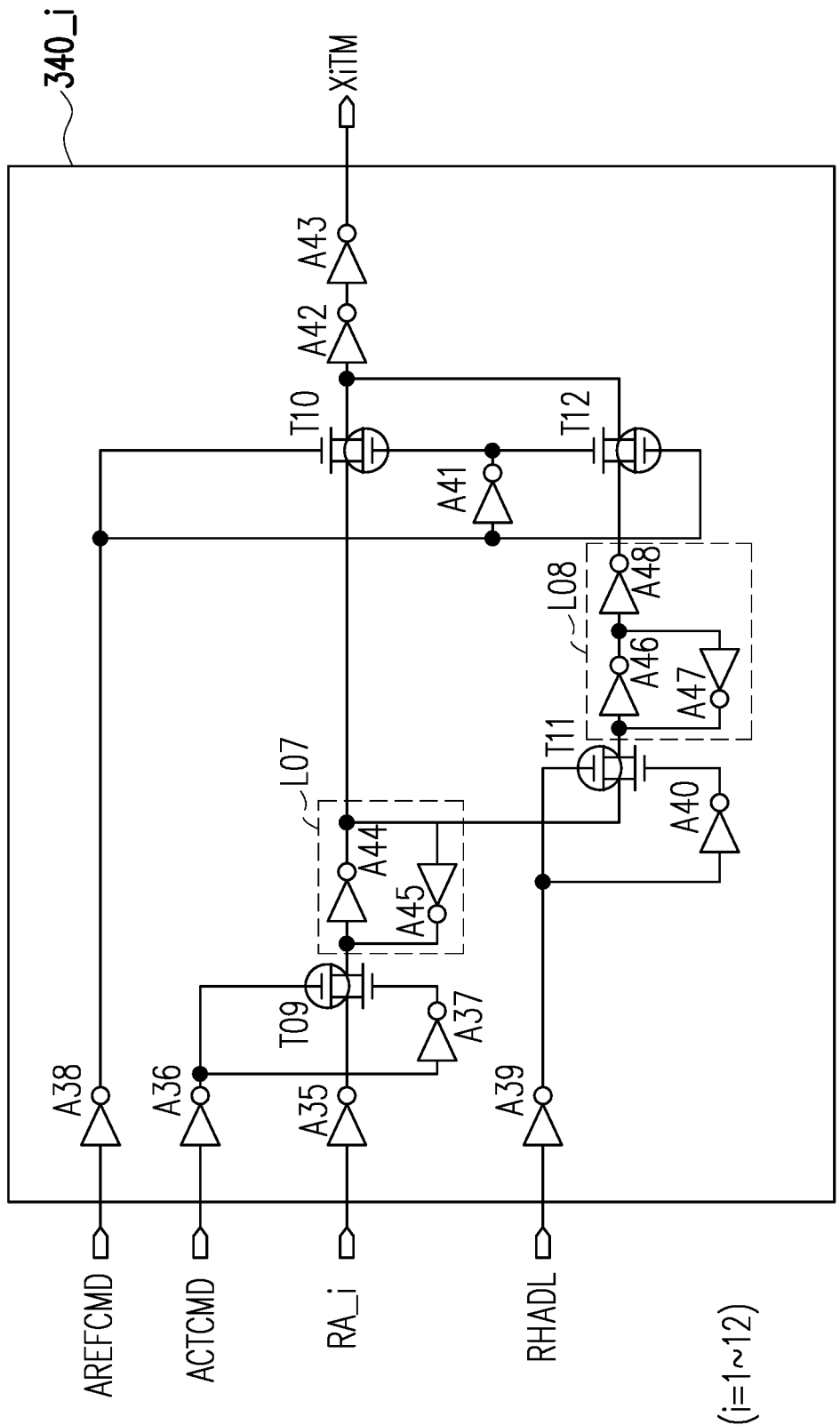
FIG. 7 illustrates schematic circuitry of a memory row address buffer according to an embodiment of the disclosure.

Please refer to FIG. 7, which illustrates schematic circuitry of a memory row address buffer according to an embodiment of the disclosure. The number of the memory row address buffers 340_i is twelve according to the present embodiment. The memory row address buffer 340_1 taken for example may receive the memory row address RA_1 corresponding to the access command ACTCMD, the refreshing command AREFCMD, and the address latch signal RHADL. The memory row address buffer 340_1 includes inversion gates A35-A43, transmission gates T09-T12, and latch circuits L07 and L08.

An input terminal of the inversion gate A35 is configured to receive the memory row address RA_1. An output terminal of the inversion gate A35 is coupled to an input terminal of the transmission gate T09. An input terminal of the inversion gate A36 receives the access command ACTCMD. An output terminal of the inversion gate A36 is coupled to a p-channel gate of the transmission gate T09. An input terminal of the inversion gate A37 is coupled to the output terminal of the inversion gate A36. An output terminal of the inversion gate A37 is coupled to an n-channel gate of the transmission gate T09. An output terminal of the transmission gate T09 is coupled to an input terminal of the latch circuit L07. An output terminal of the latch circuit L07 is coupled to an input terminal of the transmission gate T10 and an input terminal of the transmission gate T11. The latch circuit L07 includes inversion gates A44 and A45. An input terminal of the inversion gate A44 is coupled to an output terminal of the inversion gate A45 and the output terminal of the transmission gate T09. An output terminal of the inversion gate A44 is coupled to an input terminal of the inversion gate A45. An input terminal of the inversion gate A38 is configured to receive the refreshing command AREFCMD. An output terminal of the inversion gate A38 is coupled to an n-channel gate of the transmission gate T10 and a p-channel gate of the transmission gate T12. An input terminal of the inversion gate A39 is configured to receive the address latch signal RHADL. An output terminal of the inversion gate A39 is coupled to a p-channel gate of the transmission gate T11. An input terminal of the inversion gate A40 is coupled to the output terminal of the inversion gate A39. An output terminal of the inversion gate A40 is coupled to an n-channel gate of the transmission gate T11. An output terminal of the transmission gate T11 is coupled to an input terminal of the latch circuit L08. An output terminal of the latch circuit L08 is coupled to an input terminal of the transmission gate T12. The latch circuit L08 includes inversion gates A46-A48. An input terminal of the inversion gate A46 and an output terminal of the inversion gate A47 are commonly coupled to the output terminal of the transmission gate T11. An output terminal of the inversion gate A46 and an input terminal of the inversion gate A47 are commonly coupled to an input terminal of the inversion gate A48. An output terminal of the inversion gate A48 is configured as an input terminal of the latch circuit L08. An input terminal of the inversion gate A41 is coupled to the output terminal of the inversion gate A38. An output terminal of the inversion gate A41 is coupled to a p-channel gate of the transmission gate T10 and an n-channel gate of the transmission gate T12. An input terminal of the inversion gate A42 is coupled to an output terminal of the transmission gate T10 and an output terminal of the transmission gate T12. An output terminal of the inversion gate A42 is coupled to an input terminal of the inversion gate A43. An output terminal of the inversion gate A43 is coupled to an output terminal of the memory row address buffer 340_1.

The memory row address buffer 340_2 taken for example may receive the memory row address RA_2 corresponding to the access command ACTCMD. The memory row address buffer 340_3 taken for example may receive the memory row address RA_3 corresponding to the access command ACTCMD, and the rest may be deduced therefrom.

Figure 8:
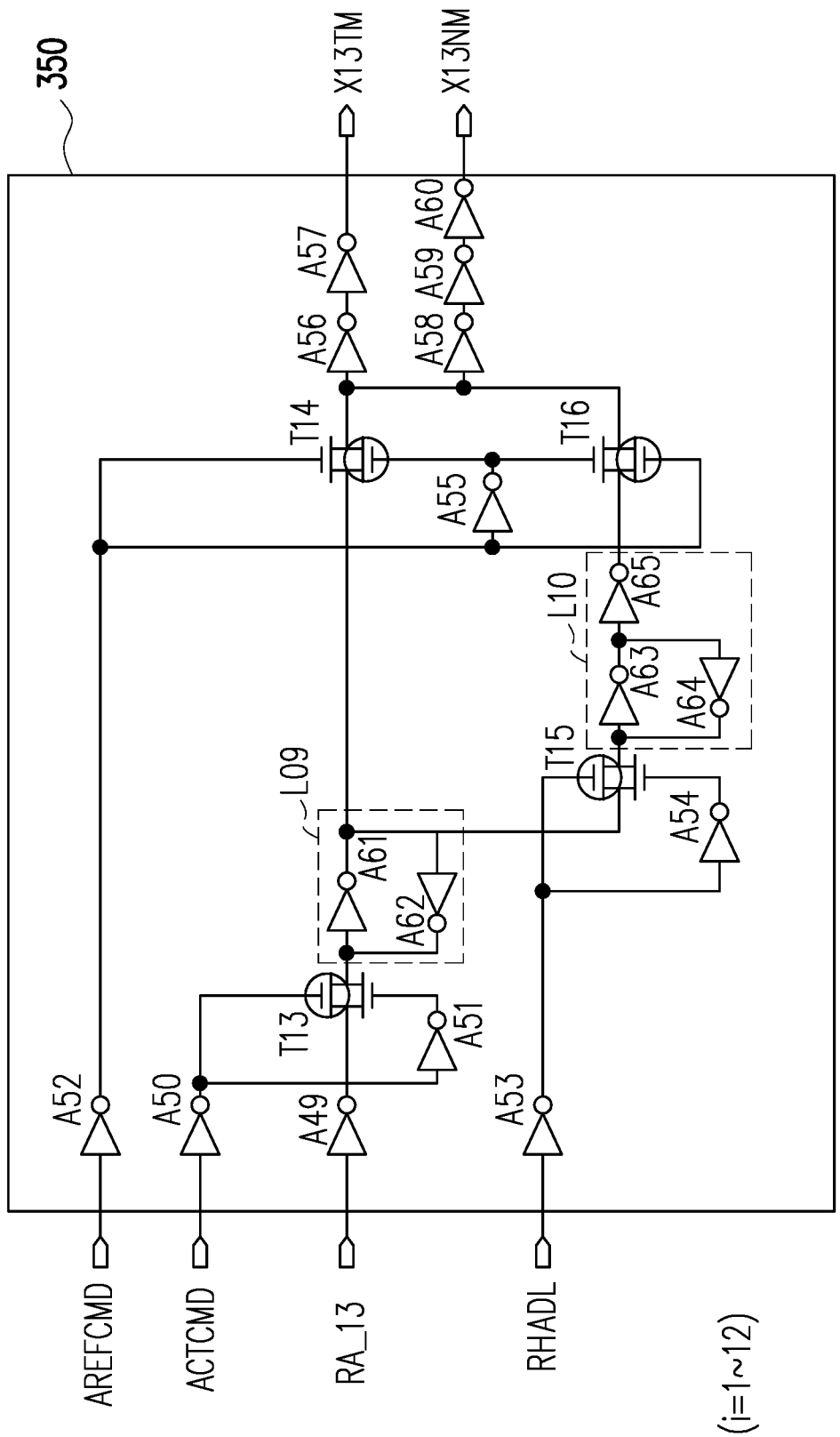
FIG. 8 illustrates schematic circuitry of a memory row address buffer according to an embodiment of the disclosure.

Please refer to FIG. 8, which illustrates schematic circuitry of a memory row address buffer according to an embodiment of the disclosure. The memory row address buffer 350 may receive the memory row address RA_13 corresponding to the access command ACTCMD, the refreshing command AREFCMD, and the address latch signal RHADL. The memory row address buffer 350 includes inversion gates A49-A60, transmission gates T13-T16, and latch circuits L09 and L10.

An input terminal of the inversion gate A49 is configured to receive the memory row address RA_13. An output terminal of the inversion gate A49 is coupled to an input terminal of the transmission gate T13. An input terminal of the inversion gate A50 receives the access command ACTCMD. An output terminal of the inversion gate A50 is coupled to a p-channel gate of the transmission gate T13. An input terminal of the inversion gate A51 is coupled to the output terminal of the inversion gate A50. An output terminal of the inversion gate A51 is coupled to an n-channel gate of the transmission gate T13. An output terminal of the transmission gate T13 is coupled to an input terminal of the latch circuit L09. An output terminal of the latch circuit L09 is coupled to an input terminal of the transmission gate T14 and an input terminal of the transmission gate T15. The latch circuit L09 includes inversion gates A61 and A62. An input terminal of the inversion gate A61 is coupled to an output terminal of the inversion gate A62 and the output terminal of the transmission gate T13. An output terminal of the inversion gate A61 is coupled to an input terminal of the inversion gate A62. An input terminal of the inversion gate A52 is configured to receive the refreshing command AREFCMD. An output terminal of the inversion gate A52 is coupled to an n-channel gate of the transmission gate T14 and a p-channel gate of the transmission gate T16. An input terminal of the inversion gate A53 is configured to receive the address latch signal RHADL. An output terminal of the inversion gate A53 is coupled to a p-channel gate of the transmission gate T15. An input terminal of the inversion gate A54 is coupled to the output terminal of the inversion gate A53. An output terminal of the inversion gate A54 is coupled to an n-channel gate of the transmission gate T15. An output terminal of the transmission gate T15 is coupled to an input terminal of the latch circuit L10. An output terminal of the latch circuit L10 is coupled to an input terminal of the transmission gate T16. The latch circuit L10 includes inversion gates A63-A65. An input terminal of the inversion gate A63 and an output terminal of the inversion gate A64 are commonly coupled to an output terminal of the transmission gate T15. An output terminal of the inversion gate A63 and an input terminal of the inversion gate A64 are commonly coupled to an input terminal of the inversion gate A65. An output terminal of the inversion gate A65 is configured as an input terminal of the latch circuit L10. An input terminal of the inversion gate A55 is coupled to the output terminal of the inversion gate A52. An output terminal of the inversion gate A55 is coupled to a p-channel gate of the transmission gate T14 and an n-channel gate of the transmission gate T16. An input terminal of the inversion gate A56 is coupled to an output terminal of the transmission gate T14 and an output terminal of the transmission gate T16. An output terminal of the inversion gate A56 is coupled to an input terminal of the inversion gate A53. An output terminal of the inversion gate A57 is coupled to a first output terminal of the memory row address buffer 350. An input terminal of the inversion gate A58 is coupled to the output terminal of the transmission gate T14 and the output terminal of the transmission gate T16. An output terminal of the inversion gate A58 is coupled to an input terminal of the inversion gate A59. An output terminal of the inversion gate A59 is coupled to an input terminal of the inversion gate A60. An output terminal of the inversion gate A60 is coupled to a second output terminal of the memory row address buffer 350. Note that the embodiment may also be applicable to the embodiment shown in FIG. 2, where the memory bank 140A is divided into the memory sub-banks 142A and 142B. When the memory row address buffer 350 is applied to one single memory bank, the inversion gates A58-A60 of the memory row address buffer 350 may be removed.

Figure 9:
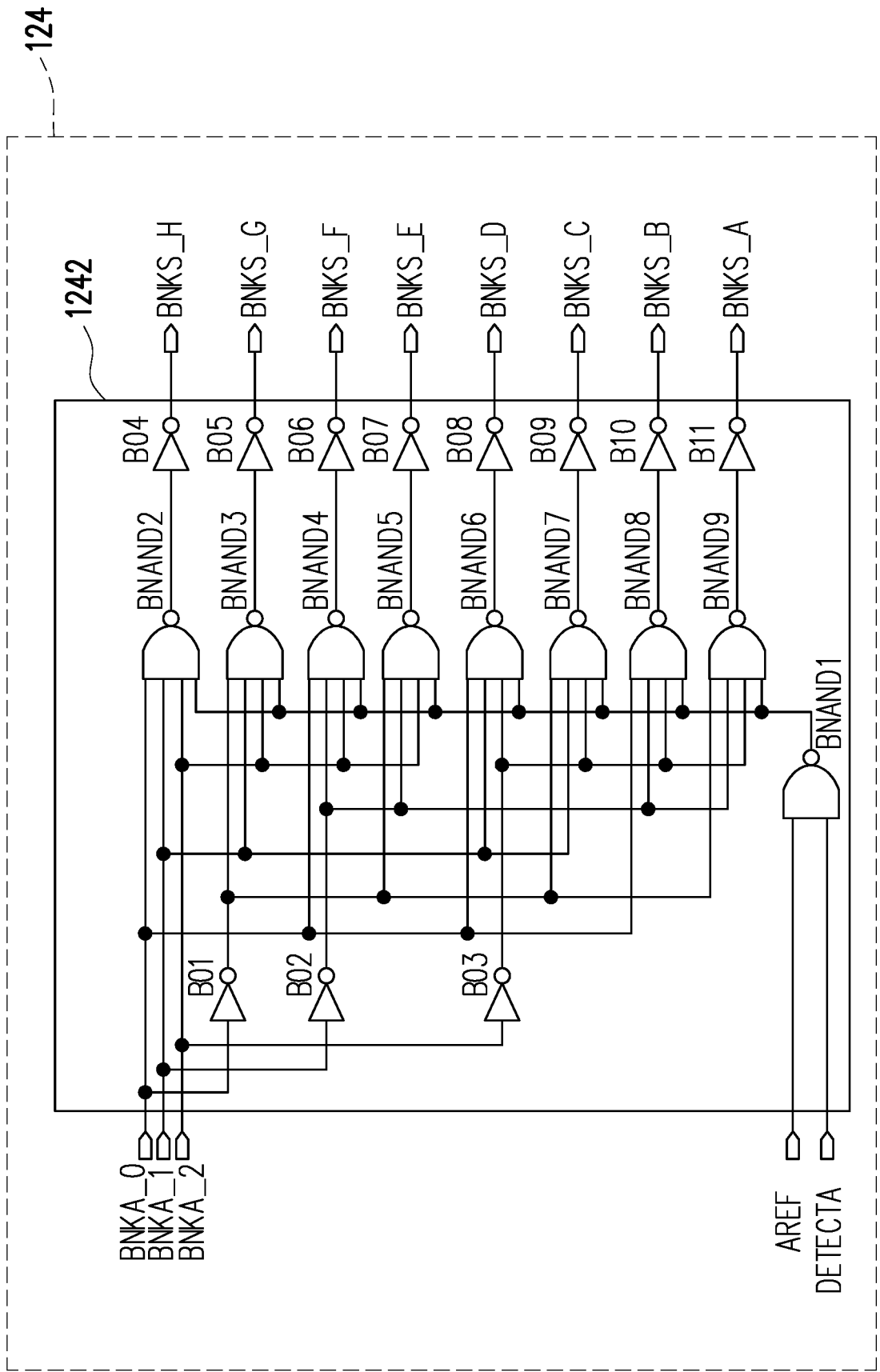
FIG. 9 illustrates schematic circuitry of an address buffer controller according to an embodiment of the disclosure.

Please refer to FIG. 9, which illustrates schematic circuitry of an address buffer controller according to an embodiment of the disclosure. In the present embodiment, the address buffer controller 124 may include a memory bank selection circuit 1242. The memory bank selection circuit 1242 is configured to receive the latched memory bank addresses BNKA_0-BNKA_2 and convert the latched memory bank addresses BNKA_0-BNKA_2 into latched memory bank address selecting signals BNKS_A-BNKS_H.

In the present embodiment, the memory bank selection circuit 1242 may be a demultiplexer. The memory bank selection circuit 1242 includes NAND gates BNAND1-BNAND9 and inversion gates B01-B11.

The NAND gate BNAND1 has two input terminals. One of the input terminals of the NAND gate BNAND1 receives the detection signal DEA, and the other input terminal of the NAND gate BNAND1 receives a refreshing signal AREF. An input terminal of the NAND gate BNAND2 receives the memory bank addresses BNKA_0-BNKA_2 and is coupled to an output terminal of the NAND gate BNAND1. An output terminal of the NAND gate BNAND2 is coupled to an input terminal of the inversion gate B04. An output terminal of the inversion gate B04 is configured as the latched memory bank address selecting signal BNKS_H. The NAND gate BNAND3 receives the memory bank addresses BNKA_1-BNKA_2, receives the memory bank addresses BNKA_0 through the inversion gate B01, and is coupled to the output terminal of the NAND gate BNAND1. An output terminal of the NAND gate BNAND3 is coupled to an input terminal of the inversion gate B05. An output terminal of the inversion gate B05 is configured as the latched memory bank address selecting signal BNKS_G, and the rest may be deduced therefrom. The memory bank selection circuit 1242 is enabled or disabled according to the detection signal DEA and the refreshing signal AREF. In the present embodiment, if both the detection signal DEA and the refreshing signal AREF are logic high, the memory bank selection circuit 1242 is disabled. If not, the memory bank selection circuit 1242 is enabled.

Figure 10:
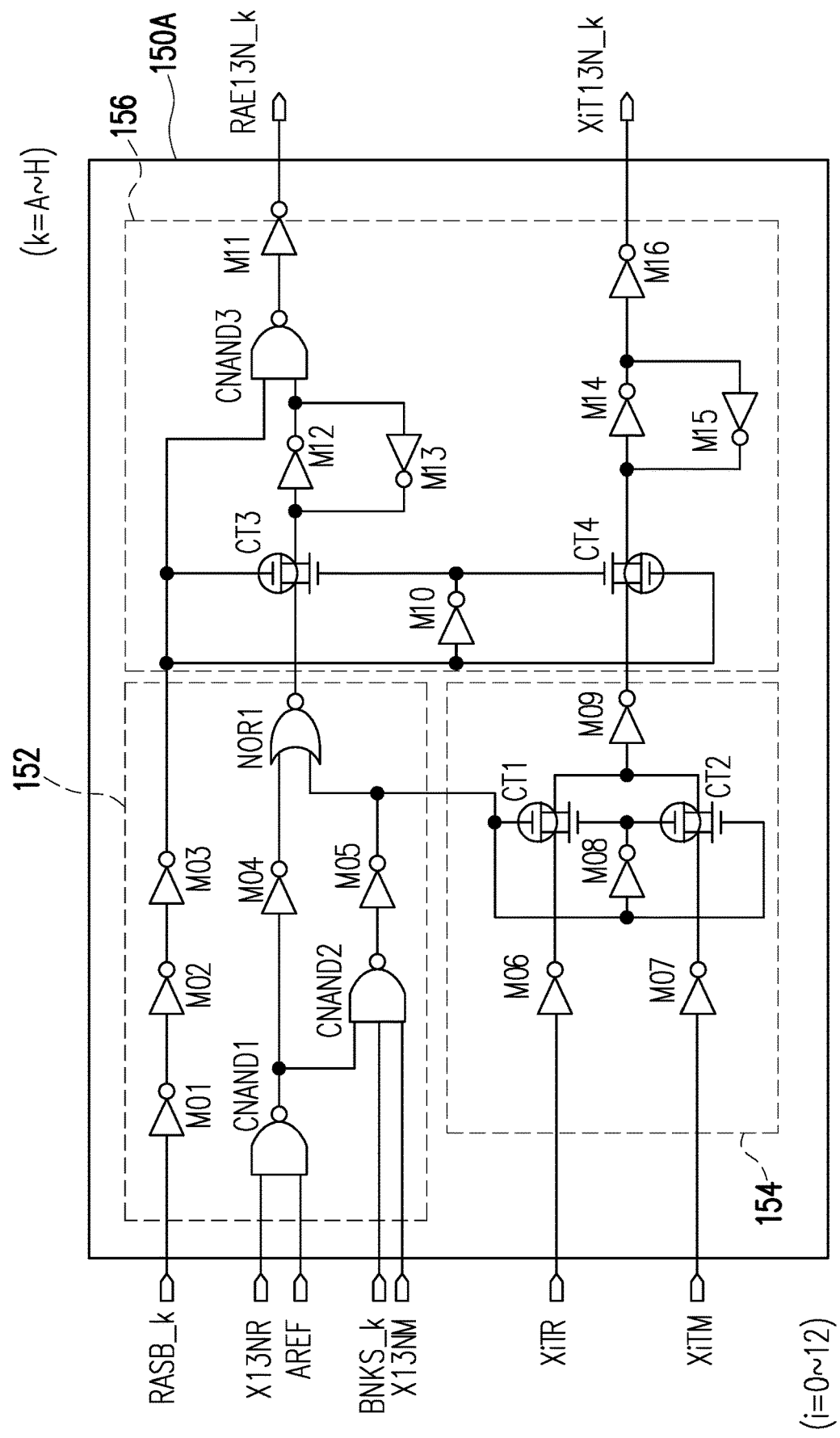
FIG. 10 illustrates schematic circuitry of a multiplexing circuit according to an embodiment of the disclosure.

Please refer to FIG. 10, which illustrates schematic circuitry of a multiplexing circuit according to an embodiment of the disclosure. In the present embodiment, the multiplexing circuit 150A taken for example includes a logic circuit 152, a selection circuit 154, and a latch circuit 156. The logic circuit 152 is configured to receive the row hammer refreshing bank address RASB_k, the refreshing row address X13NR, the refreshing signal AREF, the memory bank address selecting signal BNKS_k, and the latched row manner memory row address X13NM. The selection circuit 154 is configured to receive the refreshing row address XiTR and the latched row hammer memory row address XiTM. According to the logic computation result of the logic circuit 152, the selection circuit 154 is able to select one of the latched row hammer memory row address XiTM and the refreshing row addresses X0TR-X12TR and transmit the same to the latch circuit 156.

Specifically, in the present embodiment, the logic circuit 152 may include inversion gates M01-M05, NAND gates CNAND1-CNAND2, and a NOR gate NOR1. The selection circuit 154 may include inversion gates M06-M09 and transmission gates CT1 and CT2. The latch circuit 156 may include inversion gates M10-M16, a first input terminal of the NAND gate CNAND3, and transmission gates CT3 and CT4. The inversion gates M01-M03 are serially connected, and an input terminal of the inversion gate M01 is configured to receive the row hammer refreshing bank address RASB_k. An input terminal of the inversion gate is coupled to one of the input terminals of the NAND gate NAND3, an input terminal of the inversion gate M10, and p-channel gates of the transmission gates CT3 and CT4. An input terminal of the NAND gate CNAND1 receives the refreshing row address X13NR and the refreshing signal AREF. An output terminal of the NAND gate CNAND1 is coupled to a first input terminal of the NOR gate NOR1 through the inversion gate M04. A first input terminal of the NAND gate CNAND2 is coupled to an output terminal of the NAND gate CNAND1. A second input terminal of the NAND gate CNAND2 is configured to receive the memory bank address selecting signal BNKS_k. A third input terminal of the NAND gate CNAND2 is configured to receive the latched row hammer memory row address X13NM. Through the inversion gate M05, an output terminal of the NAND gate CNAND2 is coupled to a second input terminal of the NOR gate NOR1, a p-channel gate of the transmission gate CT1, an n-channel gate of the transmission gate CT2, and an input terminal of the inversion gate M08. An output terminal of the inversion gate M08 is coupled to an n-channel gate of the transmission gate CT1 and a p-channel gate of the transmission gate CT2. An output terminal of the NOR gate NOR1 is coupled to an input terminal of the transmission gate CT3. An input terminal of the inversion gate M06 receives the refreshing row address XiTR. An output terminal of the inversion gate M06 is coupled to an input terminal of the transmission gate CT1. An input terminal of the inversion gate M07 receives the latched row hammer memory row address XiTM. An output terminal of the inversion gate M07 is coupled to an input terminal of the transmission gate CT2. Output terminals of the transmission gates CT1 and CT2 are commonly coupled to an input terminal of the transmission gate CT4 through the inversion gate M09. An output terminal of the transmission gate CT3 is coupled to an input terminal of the inversion gate M12 and an output terminal of the inversion gate M13. An output terminal of inversion gate M12 and an input terminal of the inversion gate M13 are commonly coupled to a second input terminal of the NAND gate CNAND3. An output terminal of the NAND gate CNAND3 is coupled to an input terminal of the inversion gate M11. An output terminal of the inversion gate M11 is configured to output a bank row enabling signal RAE13N_k. An output terminal of the transmission gate CT4 is coupled to an input terminal of the inversion gate M14 and an output terminal of the inversion gate M15. An output terminal of inversion gate M14 and an input terminal of the inversion gate M15 are commonly coupled to an input terminal of the inversion gate M16. An output terminal of the inversion gate M16 is configured to output a bank row address signal XiT13TK.

Figure 11:
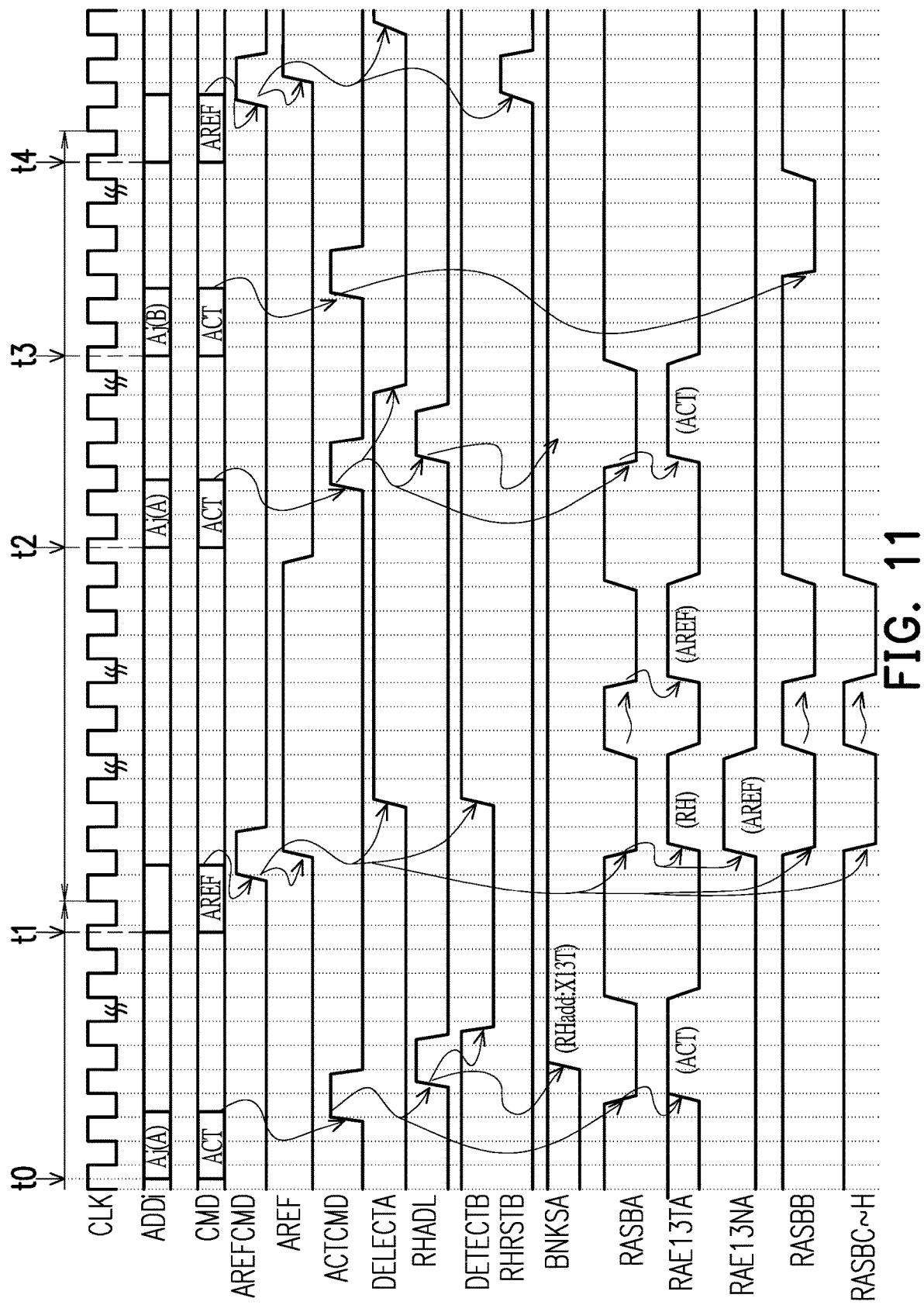
FIG. 11 is a schematic view of an operation waveform of a memory device according to an embodiment of the disclosure.

FIG. 11 is a schematic view of an operation waveform of a memory device according to an embodiment of the disclosure. With reference to FIG. 2, FIG. 4, and FIG. 11, at a time point t0, the row hammer address latch signal generator 310 receives the access command ACTCMD; when the first count value C1 is equal to the second count value C2, the exclusive-NOR gate XNOR1 output signals at high logic level because the first count value C1 and the second count value C2 are identical. Upon receiving the logic-high signals provided by the exclusive-NOR gate XNOR1 and the delayed logic-high access command ACTCMD, the NAND gates NAND1 and NAND3 output the logic-high address latch signal RHADL to latch the memory bank address and the memory row address corresponding to the access command ACTCMD. At this time, the memory control circuit 120 may perform the access operation on the memory bank address and the memory row address corresponding to the access command ACTCMD, and obtain the memory bank address (e.g., the memory bank address BA_m) and the memory row address corresponding to the access command ACTCMD through the logic-high address latch signal RHADL. The voltage level of the detection signal DEA is maintained at the low logic level because the access command ACTCMD is received. Subsequently, the access command ACTCMD is ended, so that the logic level of the address latch signal RHADL is pulled down to the low logic level. The detection signal generating circuit DET2 pulls down the voltage level of the detection signal DEB because of receiving the output result of the NAND gate NAND1 delayed by the retarder D4 and phase-inverted. In the following process, since the voltage level of the detection signal DEA is maintained at the low logic level, and the second count value C2 remains unchanged, the access command ACTCMD received before receiving the refreshing command AREFCMD does not generate the logic-high address latch signal RHADL.

Next, at a time point t1, the refreshing command AREFCMD is generated at a fixed time (e.g., 3.9 microseconds). The second count value C2 is incremented, and the first count value C1 is reset. At this time, the voltage level of the refreshing signal AREF is boosted to a high logic level. Here, for instance, the multiplexing circuit 150A outputs the bank row enabling signal RAE13N_A, so as to perform a corresponding row hammer refreshing operation on the memory sub-bank 142A corresponding to the memory bank address selecting signal BNKS_A. The voltage levels of the detection signals DEA and DEB are boosted by the delayed refreshing command AREFCMD. In the present embodiment, when the corresponding row hammer refreshing operation is performed on the memory sub-bank 142A, a corresponding refreshing operation may be performed on the memory sub-bank 142B; after the refreshing operation performed on the memory sub-bank 142B is completed, the refreshing operation is performed on the memory sub-bank 142A. After the refreshing operations performed on the memory sub-banks 142A and 142B are both completed, the voltage level of the refreshing signal AREF is pulled down to the low logic level.

The operation details of latching the memory bank address and the memory row address with use of the address latch signal RHADL are described hereinafter. With reference to FIG. 5 to FIG. 8 and FIG. 11, at the time point t0, the memory bank address buffer 320_m receives the access command ACTCMD, so that the memory bank address BA_m corresponding to the access command ACTCMD may be transmitted through the transmission gate T01, the latch circuit L03, and the transmission gate T02 to output the latched memory bank address BNKA_m. The memory row address buffer 330 receives the access command ACTCMD, so that the memory row address RA_0 corresponding to the access command ACTCMD may be transmitted through the transmission gate T05, the latch circuit L05, and the transmission gate T06 to output the latched row hammer memory row address X0TM. The memory row address buffer 340_i receives the access command ACTCMD, so that the memory row address RA_i corresponding to the access command ACTCMD may be transmitted through the transmission gate T09, the latch circuit L07, and the transmission gate T10 to output the latched row hammer memory row address XiTM. The memory row address buffer 350 receives the access command ACTCMD, so that the memory row address RA_13 corresponding to the access command ACTCMD may be transmitted through the transmission gate T13, the latch circuit L09, and the transmission gate T14 to output: the latched row hammer memory row address X13TM.

After that, the logic-high address latch signal RHADL is generated; therefore, in the memory bank address buffer 320_m, the memory bank address BA_m corresponding to the access command ACTCMD is transmitted through the transmission gate T01, the latch circuit L03, and the transmission gate T03 and latched by the latch circuit L04. Similarly, in the memory row address buffer 330, the memory row address RA_0 corresponding to the access command ACTCMD is transmitted through the transmission gate T05, the latch circuit L05, and the transmission gate T07 and latched by the latch circuit L06. In the memory row address buffer 340_i, the memory row address RA_i corresponding to the access command ACTCMD is transmitted through the transmission gate T09, the latch circuit L07, and the transmission gate T11 and latched by the latch circuit L08. In the memory row address buffer 350, the memory row address RA_13 corresponding to the access command ACTCMD is transmitted through the transmission gate T13, the latch circuit L09, and the transmission gate T15 and latched by the latch circuit L10.

At a time point t2, the memory bank address buffer 320_m receives the refreshing command AREFCMD to turn off the transmission gate T02 and turn on the transmission gate T04. The memory bank address BA_m latched by the latch circuit L04 may be output as the latched memory bank address BNKA_m through the transmission gate T04. The memory row address buffer 330 receives the refreshing command AREFCMD to turn off the transmission gate T06 and turn on the transmission gate T08. The memory row address RA_0 latched to the latch circuit L06 may be output as the latched row hammer memory row address X0TM through the transmission gate T08.

Note that the logic level of the latched row hammer memory row address X0TM is opposite to the logic level of the memory row address RA_0. Thereby, the row hammer refreshing operation may be performed on the memory cells at memory row addresses adjacent to the memory row address RA_0 where the access operation is performed.

The memory row address buffer 340_i receives the refreshing command AREFCMD to turn off the transmission gate T10 and turn on the transmission gate T12. The memory row address RA_i latched to the latch circuit L08 may be output as the latched row hammer memory row address XiTM through the transmission gate T12. The memory row address buffer 350 receives the refreshing command AREFCMD to turn off the transmission gate T14 and turn on the transmission gate T16. The memory row address RA_13 latched to the latch circuit L10 may be output as the latched row hammer memory row address X13TM through the transmission gate T16.

With reference to FIG. 2, FIG. 4, and FIG. 11, at the time point t2, when the first access command ACTCMD is issued, the voltage level of the latched detection signal DEA remains logic high, and thus the row hammer address latch signal generator 310 generates the logic-high address latch signal RHADL. In an embodiment of the disclosure, the memory control circuit 120 may latch the memory bank address and the memory row address corresponding to the first access command ACTCMD following the refreshing command AREFCMD. Similarly, the memory control circuit 120 may perform the access operation on the memory bank address and the memory row address corresponding to the access command ACTCMD. The voltage level of the detection signal DEA is pulled down to the low logic level due to the delayed access command ACTCMD; hence, if the first count value C1 generated after subsequently receiving the access command ACTCMD is not equal to the second count value C2 (at a time point t3), the voltage level of the address latch signal RHADL remains at the low logic level. That is, if the first count value C1 is not equal to the second count value C2, the latched memory bank address and the latched memory row address generated by the first access command ACTCMD are continuously latched until the first count value C1 is equal to the second count value C2. Thereby, in one or more embodiments of the disclosure, the latch operation of the row hammer refreshing bank address is performed on the memory row address where the access operation is already performed during two adjacent refreshing operations, and the refreshing operation is performed, so as to prevent the stored data from being lost because of memory cell row hammer phenomenon and reduce redundant refreshing operations.

If the second count value C2 is reset when the first count value C1 is smaller than the second count value C2 and when the refreshing command is received, e.g., at a time point t4, on the condition that the voltage level of the detection signal DEB remains logic high, the row hammer address latch signal generator 310 receives the refreshing command AREFCMD and then enables the logic comparison circuit 430 to generate the logic-high reset signal RHRSTB, so as to reset the second count value C2.

In another situation, the memory control circuit 120 does not latch the memory bank address and the memory row address when the access command ACTCMD is not received during two adjacent refreshing commands AREFCMD. Thereby, the memory control circuit 120 is able to reduce the power consumption of the memory device due to the reduction of the redundant row manner refreshing operations.

Figure 12:
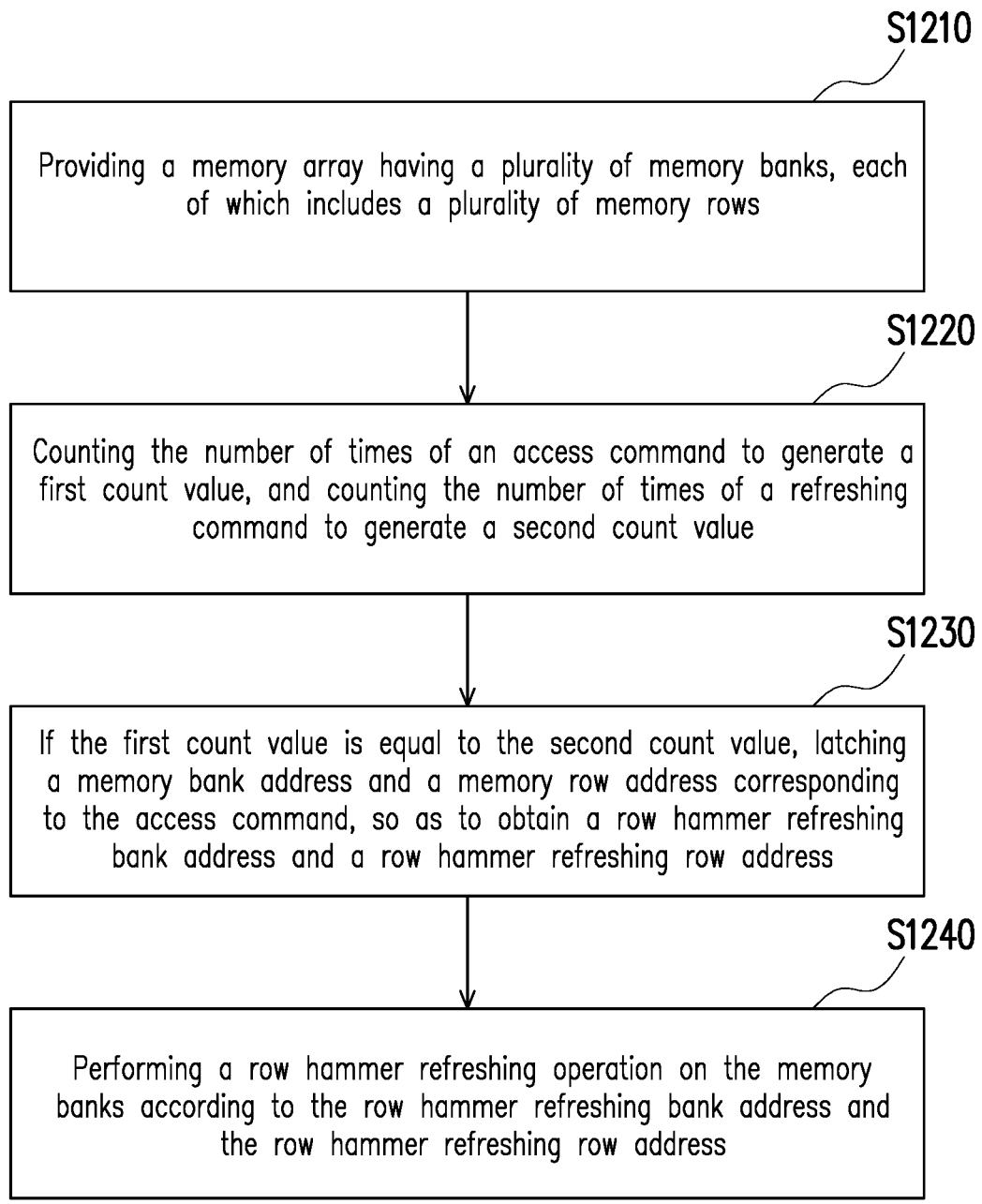
FIG. 12 is a flowchart of updating data in a memory device according to an embodiment of the disclosure.

FIG. 12 is a flowchart of updating data in a memory device according to an embodiment of the disclosure. With reference to FIG. 12, the refreshing method of the memory device at least includes following steps. In step S1210, a memory array is provided. The memory array has a plurality of memory banks, and each of the memory banks includes a plurality of memory rows. In step S1220, the number of times of an access command is counted to generate a first count value, and the number of times of a refreshing command is counted to generate a second count value. In step S1230, if the first count value is equal to the second count value, a memory bank address and a memory row address corresponding to the access command are latched, so as to obtain a row hammer refreshing bank address and a row hammer refreshing row address. In step S1240, a row hammer refreshing operation is performed on the memory banks according to the row hammer refreshing bank address and the row hammer refreshing row address. The implementation details of the above steps have been described in detail in the foregoing embodiments and will not be repeated below.

It will be apparent to those skilled in the art that various modifications and variations can be made to the structure described in the disclosure without departing from the scope or spirit of the disclosure. In view of the foregoing, it is intended that the disclosure cover modifications and variations provided they fall within the scope of the following claims and their equivalents.

What is claimed is:

1. A memory device comprising:
a memory array having a plurality of memory banks, each of the plurality of memory banks comprising a plurality of memory rows; and
a memory control circuit coupled to the plurality of memory banks, counting a number of times of an access command to generate a first count value, and counting a number of times of a refreshing command to generate a second count value, wherein the memory control circuit latches a memory bank address and a memory row address corresponding to the access command when the first count value is equal to the second count value to obtain a row hammer refreshing bank address and a row hammer refreshing row address, and the memory control circuit performs a row hammer refreshing operation on the plurality of memory banks according to the row hammer refreshing bank address and the row hammer refreshing row address.

2. The memory device as recited in claim 1, wherein the memory control circuit is further configured to latch the memory bank address and the memory row address corresponding to a first access command following the refreshing command, and configured not to latch the memory bank address and the memory row address if the access command is not received during a period between two of the refreshing commands adjacent to each other.

3. The memory device as recited in claim 1, wherein the memory control circuit is further configured to:
reset the first count value when receiving the refreshing command, and reset the second count value if the first count value is smaller than the second count value and if the refreshing command is received.

4. The memory device as recited in claim 1, wherein the memory control circuit comprises:
a row hammer refreshing address buffer receiving the access command, the memory bank address corresponding to the access command, the memory row address corresponding to the access command, and the refreshing command, counting the number of times of receiving the command to generate the first count value when receiving the access command, counting the number of times of receiving the refreshing command to generate the second count value when receiving the refreshing command, and providing the latched memory bank address and the latched memory row address according to the access command, the refreshing command, the first count value, and the second count value;
an address buffer controller coupled to the row hammer refreshing address buffer, the address buffer controller obtaining the row hammer refreshing bank address according to the latched memory bank address; and a refreshing address buffer receiving the refreshing command and providing a refreshed row address to one of the plurality of memory banks according to the refreshing command.

5. The memory device as recited in claim 4, wherein the row hammer refreshing address buffer comprises:

a row hammer address latch signal generator generating a comparison result according to the first count value and the second count value, and providing an address latch signal according to the comparison result;

a plurality of memory bank address buffers receiving the memory bank address corresponding to the access command and the address latch signal, and latching the memory bank address according to the address latch signals; and a plurality of memory row address buffers receiving the memory row address corresponding to the access command and the address latch signal, and latching the memory row address according to the address latch signal.

6. The memory device as recited in claim 5, wherein the row hammer address latch signal generator comprises:

a first counter for counting the number of times of receiving the access command when receiving the access command, so as to increment the first count value;

a second counter for counting the number of times of receiving the refreshing command when receiving the refreshing command, so as to increment the second count value;

a logic comparison circuit coupled to the first counter and the second counter, receiving the access command and the refreshing command for comparing the first count value and the second count value to obtain the comparison result, and generating an enabled address latch signal according to the comparison result indicating that the first count value is equal to the second count value.

7. A refreshing method of a memory device, comprising:

providing a memory array, the memory array having a plurality of memory banks, each of the plurality of memory banks comprising a plurality of memory rows;

counting a number of times of an access command to generate a first count value and counting a number of times of a refreshing command to generate a second count value;

when the first count value is equal to the second count value, latching a memory bank address and a memory row address corresponding to the access command to obtain a row hammer refreshing bank address and a row hammer refreshing row address; and performing a row hammer refreshing operation on the plurality of memory banks according to the row hammer refreshing bank address and the row hammer refreshing row address.

8. The refreshing method as recited in claim 7, further comprising:

latching the memory bank address and the memory row address corresponding to a first access command following the refreshing command; and not latching the memory bank address and the memory row address if the access command is not received during the refreshing command.

9. The refreshing method as recited in claim 7, further comprising:

resetting the first count value when receiving the refreshing command; and resetting the second count value when the first count value is smaller than the second count value and when the refreshing command is received.

10. The refreshing method as recited in claim 7, wherein the step of counting the number of times of the access command to generate the first count value and counting the number of times of the refreshing command to generate the second count value comprises:

receiving the access command, the memory bank address corresponding to the access command, the memory row address corresponding to the access command, and the refreshing command;

counting the number of times of receiving the access command when receiving the access command, so as to generate the first count value; and counting the number of times of receiving the refreshing command when receiving the refreshing command, so as to generate the second count value.

* * * * *